US009503031B2

(12) United States Patent
Lee et al.

(10) Patent No.: US 9,503,031 B2
(45) Date of Patent: Nov. 22, 2016

(54) ELECTRONIC SYSTEM AND AUTO CONFIGURATION METHOD FOR AN OPERATIONAL AMPLIFIER IN THE ELECTRONIC SYSTEM

(71) Applicant: Winbond Electronics Corp., Taichung (TW)

(72) Inventors: Sheng-Cheng Lee, New Taipei (TW); Herming Chiueh, Taipei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/601,772

(22) Filed: Jan. 21, 2015

(65) Prior Publication Data

US 2016/0211808 A1    Jul. 21, 2016

(51) Int. Cl.
H03F 3/45    (2006.01)
H03F 1/30    (2006.01)

(52) U.S. Cl.
CPC .......... *H03F 1/301* (2013.01); *H03F 3/45179* (2013.01); *H03F 2203/45042* (2013.01); *H03F 2203/45116* (2013.01)

(58) Field of Classification Search
CPC ........................... H03F 3/45; H03F 2200/234
USPC ................................... 330/2, 69, 86
See application file for complete search history.

(56) References Cited

U.S. PATENT DOCUMENTS 4,928,311 A * 5/1990 Trompler ............. H03G 11/002
330/2

* cited by examiner

*Primary Examiner* — Steven J Mottola
(74) *Attorney, Agent, or Firm* — Muncy, Geissler, Olds & Lowe, P.C.

(57) ABSTRACT

The invention provides an auto configuration method for an operational amplifier in an electronic system. The method includes steps of estimating an internal resistance of the electronic system; estimating an operation frequency of the electronic system; and determining a control parameter to adjust a characteristic of the operational amplifier according to the internal resistance and the operation frequency.

9 Claims, 10 Drawing Sheets

ELECTRONIC SYSTEM AND AUTO CONFIGURATION METHOD FOR AN OPERATIONAL AMPLIFIER IN THE ELECTRONIC SYSTEM

BACKGROUND OF THE INVENTION

1. Field of the Invention

The present invention relates to an electronic system, and more particularly to an electronic system with auto configuration mechanism for an operational amplifier.

2. Description of the Related Art

Performance of an electronic device varies with different parameters. In this situation, characteristics of the electronic device, such as gain, noise figure, output power, an accuracy of voltage or current, may be affected accordingly. The variation of parameters may be caused because of process of elements, temperature or others.

Analog to Digital Converters play an important role in many application, such as a scanning plotting system, a digital television and biomedical electronics. These systems need high-speed, high-resolution and low power consumption signal converters. The main circuit of the analog to digital converter is an operational amplifier. If the frequency of an operation clock of the operational amplifier changes, the characteristic parameters of the operational amplifier, such as a DC-gain, a gain bandwidth product, a slew rate changes accordingly. In general, the parameters of the operation amplifier are set according to a maximum frequency of the operation clock of a system. However, if the system adopts a lower frequency of the operation clock, additional power consumption of the operational amplifier may be generated and the performance of the operational amplifier cannot be optimized due to the parameter setting.

BRIEF SUMMARY OF THE INVENTION

To solve the problem that characteristics of an operational amplifier may be different when the operational amplifier operates in different operation frequency, an operational amplifier with a self-calibration mechanism is provided. The operational amplifier automatically detects an operation frequency of a system and adjusts characteristics of the operational amplifier.

In one embodiment of the invention, when the operational amplifier determines the operation frequency of the system, the operational amplifier uses a lookup table circuit to acquire control parameters of the operational amplifier to optimize the operational amplifier.

An embodiment of the invention provides an auto configuration method for an operational amplifier in an electronic system. The method comprises steps of estimating an internal resistance of the electronic system; estimating an operation frequency of the electronic system; and determining a control parameter to adjust a characteristic of the operational amplifier according to the internal resistance and the operation frequency.

Another embodiment of the invention provides an electronic system capable of auto configuring an operational amplifier. The electronic system comprises a resistance calibration circuit, a frequency estimation circuit, a lookup table circuit and an operational amplifier. The resistance calibration circuit estimates an internal resistance of the electronic system and generates a first control signal. The frequency estimation circuit adjusts a capacitance of a capacitor bank according to the internal resistance and a clock signal of the electronic system and generates a second control signal. The lookup table circuit receives the first control signal and the second control signal to get a control parameter by using lookup table. The operational amplifier receives the control parameter to adjust a characteristic of the operation amplifier.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
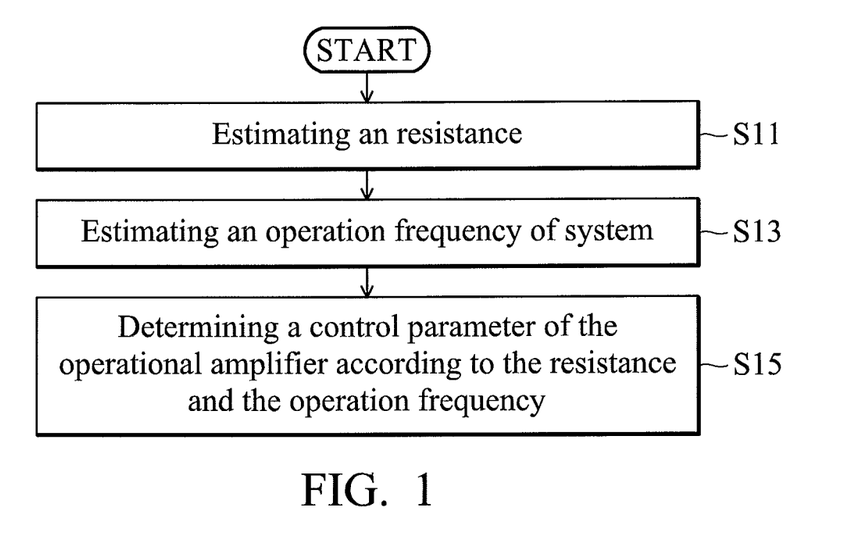
FIG. 1 is a flowchart of an auto-configuration method of an operational amplifier according to an embodiment of the invention.

FIG. 1 is a flowchart of an auto-configuration method for an operational amplifier according to an embodiment of the invention. In this embodiment, the operational amplifier is embedded in an electronic system or a circuit. The electronic system may be a filter, an analog-to-digital converter, a chip or a portable device. In step S11, a controller or a control circuit of the electronic system first estimates an equivalent resistance of the electronic system. The electronic system comprises an operational amplifier, a bandgap circuit and a current mirror circuit. The electronic system is coupled to an external resistor, and the resistance of the external resistor is known by the electronic system. The output voltage of the bandgap circuit is stable and not easily affected by an operation voltage, a temperature or a process drift. Therefore, the bandgap voltage can be used to estimate the equivalent resistance of the electronic system.

In step S12, when the resistance of the electronic system is determined, an operation frequency of the electronic system is then estimated. In one embodiment, the estimation of the operation frequency is not to determine the real operation frequency. The estimation of the operation frequency determines an equivalent capacitance of a capacitor bank of the electronic system, wherein the equivalent capacitance corresponds to the operation frequency. In step S13, when the operation frequency is determined, control parameters of the operational amplifier can be acquired by using a lookup table circuit according the operation frequency and the equivalent resistance of the electronic system. In another embodiment, when the equivalent capacitance corresponding to the operation frequency is determined, the control parameters of the operational amplifier can be acquired according to the equivalent capacitance and the equivalent resistance.

Figure 2:
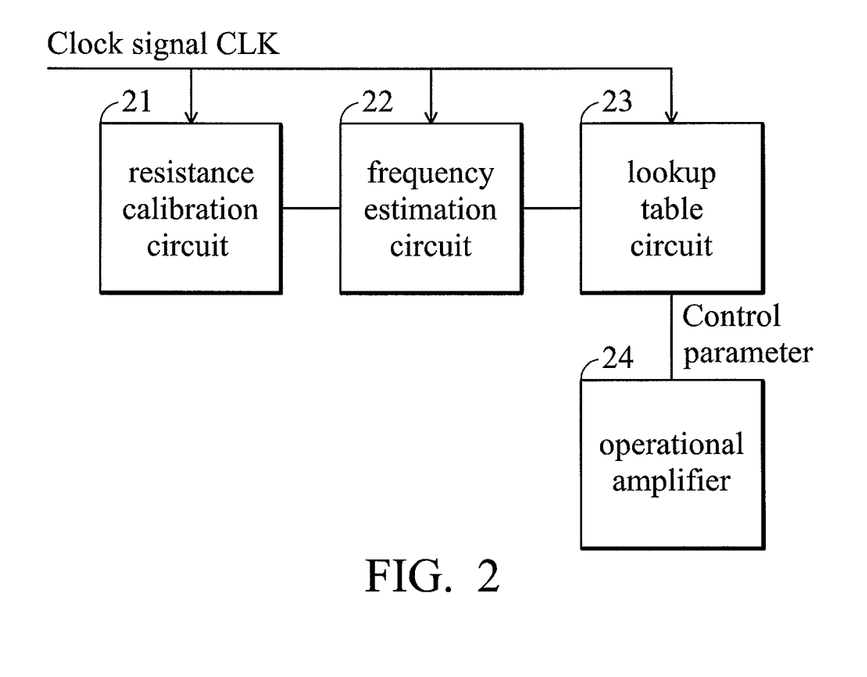
FIG. 2 is a schematic diagram of an operational amplifier with a self-calibration mechanism of an electronic system according to an embodiment of the invention.

FIG. 2 is a schematic diagram of an operational amplifier with a self-calibration mechanism of an electronic system according to an embodiment of the invention. The electronic system comprises a resistance calibration circuit 21, a frequency estimation circuit 22, a lookup circuit 23 and an operational amplifier 24.

When the electronic device is turned on, resets or receives a control signal for adjusting parameters of the operational amplifier 32, the resistance calibration circuit 21 estimates an equivalent resistance of an internal resistor of the electronic system by using a resistor bank. Then, the frequency estimation circuit 22 estimates an operation frequency of the electronic system. In another embodiment, when the operation frequency of the electronic system is determined, a processor or a controller further estimates a capacitance of a capacitor bank. Note that when a capacitance and a resistance are measured, the operation frequency and the capacitance are determined, a corresponding first control signal and a corresponding second control signal are also determined for estimating the resistance and the capacitance. In one embodiment, the first control signal and the second control signal are digital signals, the first control signal is represented as [N:0] and the second control signal is represented as [M:0], wherein N and M are positive integers, N is a number of resistors of the resistor bank, and M is a number of capacitor of the capacitor bank.

The lookup circuit 23 acquires control parameters according to the resistance and the capacitance or the first control signal and the second control signal. By using the control parameters, a DC gain, a gain bandwidth product and a slew rate of the operational amplifier 24 can be adjusted. Furthermore, an operation current of the operational amplifier 24 can be optimized by the self-calibration mechanism.

Figure 3:
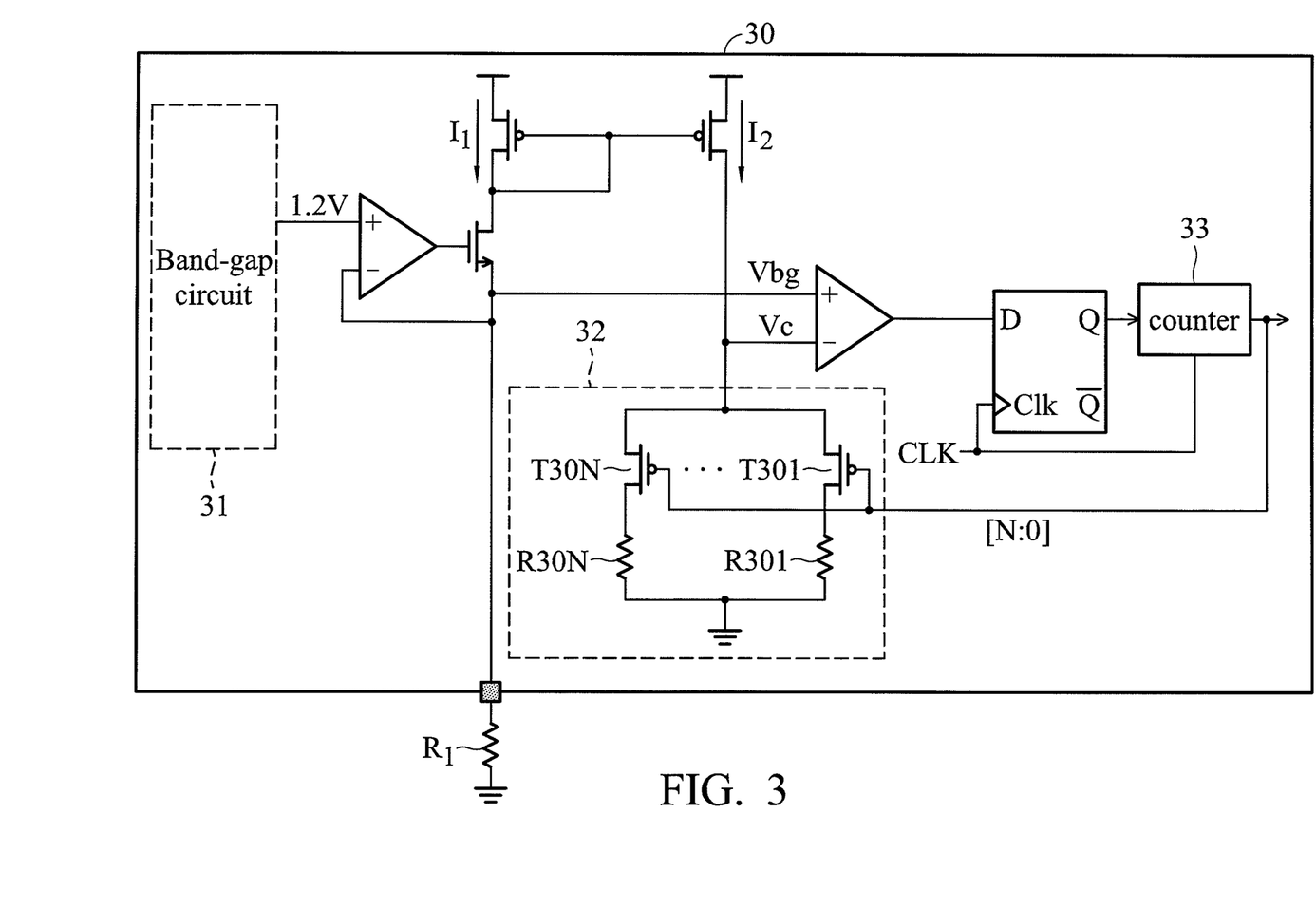
FIG. 3 is a schematic diagram of an operational amplifier with a self-calibration mechanism of an electronic system according to another embodiment of the invention.

FIG. 3 is a schematic diagram of an operational amplifier with a self-calibration mechanism of an electronic system according to another embodiment of the invention. In FIG. 3, the electronic system comprises an operational amplifier, a bandgap circuit 31 and a resistance calibration circuit 32. The bandgap circuit 31 is not easily affected by temperature or other environment variables; therefore, the bandgap circuit 31 is used to provide stable bandgap voltage. The resistance of an external resistor R1 is known, and a smaller deviation of the resistor R1 is preferable. The deviation of the resistor R1 is recommended to be 1% or 5%. In this embodiment, the internal equivalent resistance of the electronic system can be known by adjusting the resistance of the resistor bank 32.

The current mirror circuit duplicates a current $I_1$ passing through the external resistor R1 to generate a current $I_2$ passing through the resistor bank 32. The resistor bank 32 comprises a plurality of switches, such as T301~T30N, and a plurality of resistors, such as $R_{301}$~$R_{30N}$. The control signal [N:0] controls the switches to determine an equivalent resistance of the resistor bank 32. According to Kirchhoff Circuit Laws, it can be represented as:

$$V_{bg} = I_1 \times R_1 = I_2 \times R_2$$

In this embodiment, a default value of the resistance $R_2$ of the resistor bank 32 is a minimum resistance of the resistor bank 32, and the voltage Vc is smaller than the bandgap voltage $V_{bg}$. A comparator compares the voltage Vc and the bandgap voltage $V_{bg}$, and transmits a comparison result to a D type flip-flop. The counter 33 increases the control signal [N:0] by 1 bit according to the D type flip-flop. When the voltage Vc is greater than the bandgap voltage $V_{bg}$, the control signal [N:0] is then fixed. In other words, a binary counting procedure is applied to the control signal [N:0]. For example, assuming the resistor bank 32 comprises 5 resistors, and a binary ratio of the capacitance of each resistor is the same. When starting estimating the resistance, the control signal is [00001]. If the voltage Vc is smaller than the bandgap voltage $V_{bg}$, the counter 33 increases the control signal to be [00010], and then the comparator determines whether the voltage Vc is greater than the bandgap voltage $V_{bg}$ according to an output from the D type flip-flop. Assuming the voltage Vc is greater than the bandgap voltage $V_{bg}$ when the control signal is [01111], the resistance $R_2$ of the resistor bank 32 is then determined. In another embodiment, if the voltage Vc is greater than the bandgap voltage $V_{bg}$ when the control signal is [01111], the adopted control signal is a previous control signal [01110].

Similarly, a default value of the resistance $R_2$ of the resistor bank 32 can be a maximum resistance of the resistor bank 32, ant the resistance $R_2$ is decreased step by step until the voltage Vc is smaller than the bandgap voltage $V_{bg}$. In another embodiment, a default value of the resistance $R_2$ of the resistor bank 32 can be an intermediate value, and the resistance $R_2$ of the resistor bank 32 is trimmed according to the comparison result of voltage Vc and the bandgap voltage $V_{bg}$. According to described methods, the equivalent resistance R2 can be represented as an internal resistance of the electronic system.

Figure 4:
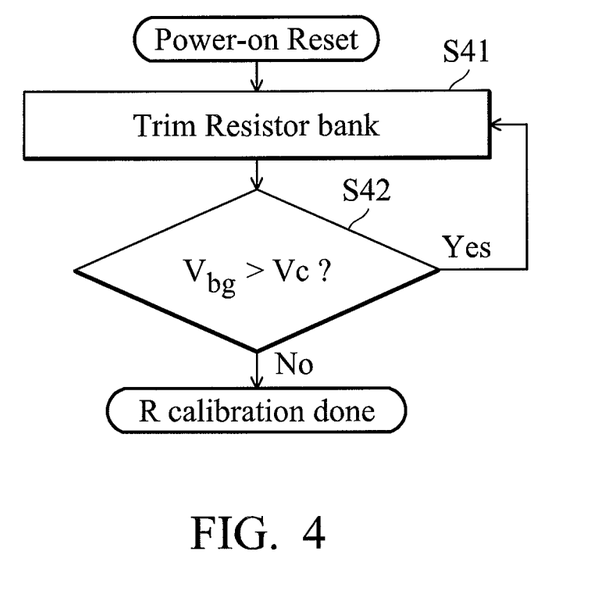
FIG. 4 is a flowchart of a resistance calibration method according to an embodiment of the invention.

FIG. 4 is a flowchart of a resistance calibration method according to an embodiment of the invention. Please refer to FIG. 3 and FIG. 4. In this embodiment, the flowchart is executed when the electronic device or the system is turned on or reset. In another embodiment, the flowchart is executed when receiving a calibration request for estimating an equivalent resistance. In step S41, the equivalent resistance of a resistor bank is first determined. In step S42, a control unit determines whether the voltage Vc is smaller than the bandgap voltage $V_{bg}$. If the bandgap voltage $V_{bg}$ is greater than the voltage Vc, the procedure returns to step S41 to trim equivalent resistance of the resistor bank. If the bandgap voltage $V_{bg}$ is smaller than the voltage Vc, the resistance calibration method ends.

When the internal resistance of the electronic system is determined, an operation clock, an operation frequency, an operation clock or a capacitance of the electronic system can be estimated by using an equation related to RC charging/discharging. The equation is represented in following:

$$V_{ref} = Vdd \times (1 - e^{-Tclk/RC}),$$

wherein $V_{ref}$ is a reference voltage, $V_{dd}$ is an operation voltage, $T_{clk}$ is a clock cycle, R is the estimated resistance an C is the capacitance.

Figure 5:
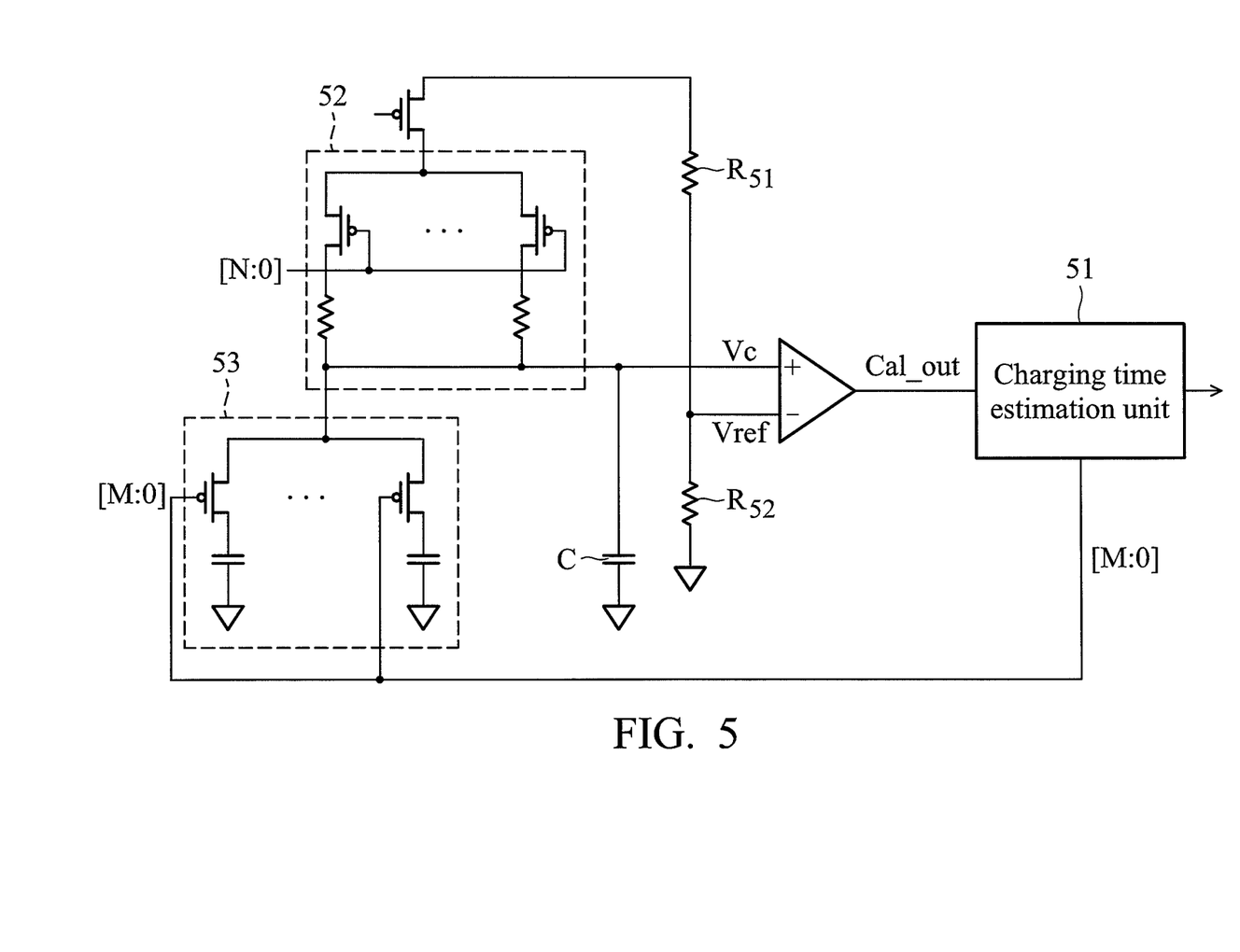
FIG. 5 is a schematic diagram of an operational amplifier with a self-calibration mechanism of an electronic system according to another embodiment of the invention.

FIG. 5 is a schematic diagram of an operational amplifier with a self-calibration mechanism of an electronic system according to another embodiment of the invention. In FIG. 5, the reference voltage $V_{ref}$ is a divided voltage determined according to resistors $R_{51}$ and $R_{52}$. The operation of resistor bank 52 can be referred to the description of FIG. 3. Since the resistance of the resistor bank 52 is determined, the following paragraphs described how to determine the capacitance of the capacitor bank 53. The capacitor bank 53 comprises a plurality of switch devices and a plurality of capacitors, the switch devices are controlled by a control signal [M:0], and the equivalent capacitance of the capacitor bank 53 is determined according to the control signal. The comparator outputs a comparison result between the output voltage Vc and the reference voltage $V_{ref}$. The charging time estimation unit 51 controls and adjusts the capacitance of the capacitor bank 53 to determine whether an operation frequency of the electronic system is correctly estimated. In one embodiment of the invention, the operation frequency of the electronic system is not directly estimated. The operation frequency of the electronic system is indirectly estimated by estimating the capacitance of the capacitor bank 53 according to pulse width of clock cycles of the electronic system.

Figure 7:
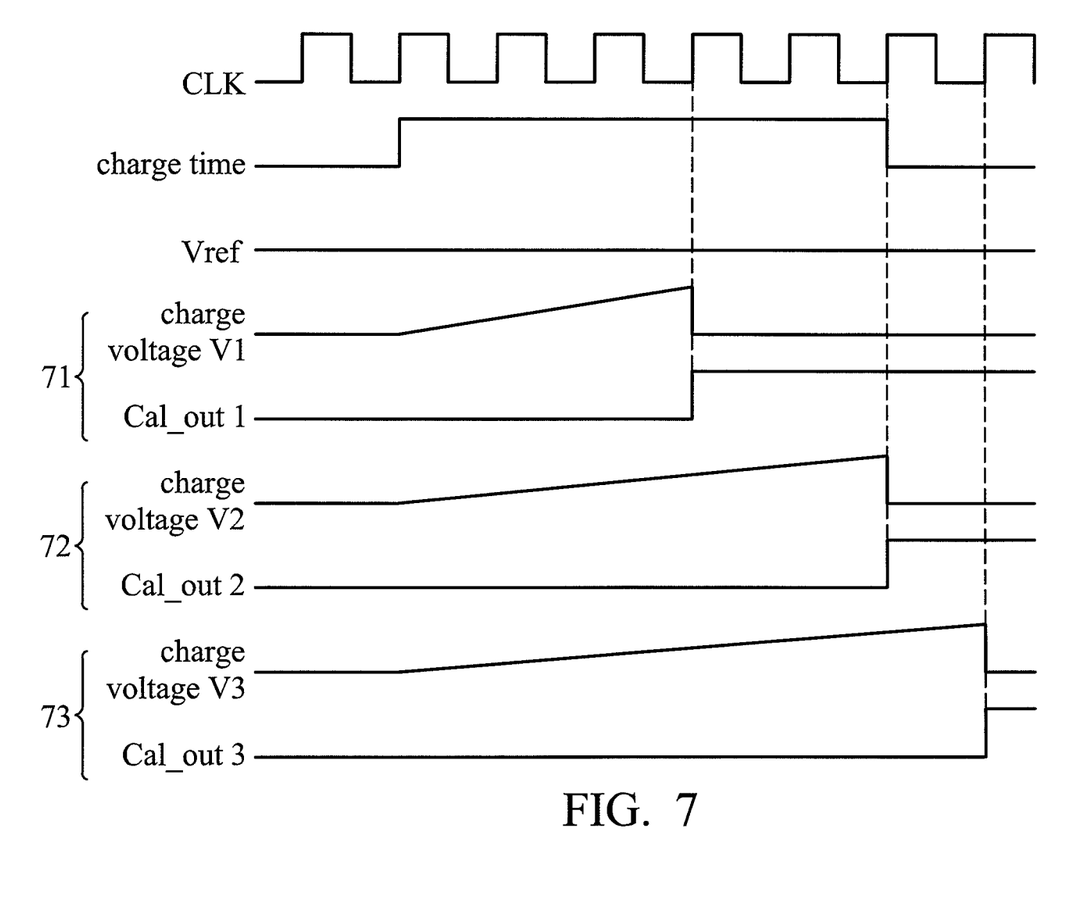
FIG. 7 is a waveform when the circuit of FIG. 5 operates.

FIG. 7 is a waveform when the circuit of FIG. 5 operates. First, a person skilled set a pulse width as a charging time according to the known clock signal CLK of the electronic system. In this embodiment, the pulse width is equal to 5 clock cycles. In FIG. 7, charging voltages V1, V2, and V3 represent voltage variations of the voltage Vc in FIG. 5 during charging operation in different conditions. The condition 71 represents voltage variation of the voltage Vc during charging when the capacitance of the capacitor 53 is too small. The charging voltage V1 is greater than the reference voltage $V_{ref}$ before the charging time ends. When the charging voltage V1 is greater than the reference voltage $V_{ref}$, the output Cal_out of the comparator is then pulled up to a high logic level. Therefore, the charging time estimation unit 51 increases the capacitance of the capacitor 53 by adjusting the control signal [M:0] under the condition 71.

The condition 73 represents voltage variation of the voltage Vc during charging when the capacitance of the capacitor 53 is too large. The charging voltage V3 is still less than the reference voltage $V_{ref}$ when the charging time ends. Therefore, the output Cal_out of the comparator is then pulled up to a high logic level after the charging time ends. Therefore, the charging time estimation unit 51 decreases the capacitance of the capacitor 53 by adjusting the control signal [M:0] under the condition 73.

The condition 72 represents voltage variation of the voltage Vc during charging when the capacitance of the capacitor 53 is correctly corresponding to the operation frequency. The charging voltage V2 is equal to the reference voltage $V_{ref}$ when the charging time ends. When the charging voltage V2 is equal to the reference voltage $V_{ref}$, the output Cal_out of the comparator is then pulled up to a high logic level. Therefore, the charging time estimation unit 51 is able to determine whether the capacitance of the capacitor 53 correctly corresponds to the operation frequency by determining whether a first time point that the charging time ends matches to a second time point that the charging voltage is equal to the reference voltage $V_{ref}$.

When the capacitance of the capacitor bank 53 and the resistance of the resistor bank 52 are determined, the control signals [N:0] and [M:0] are transmitted to a lookup table circuit to gain control parameters for the operational amplifier. Then, the operational amplifier is optimized by using the control parameters.

Figure 6A:
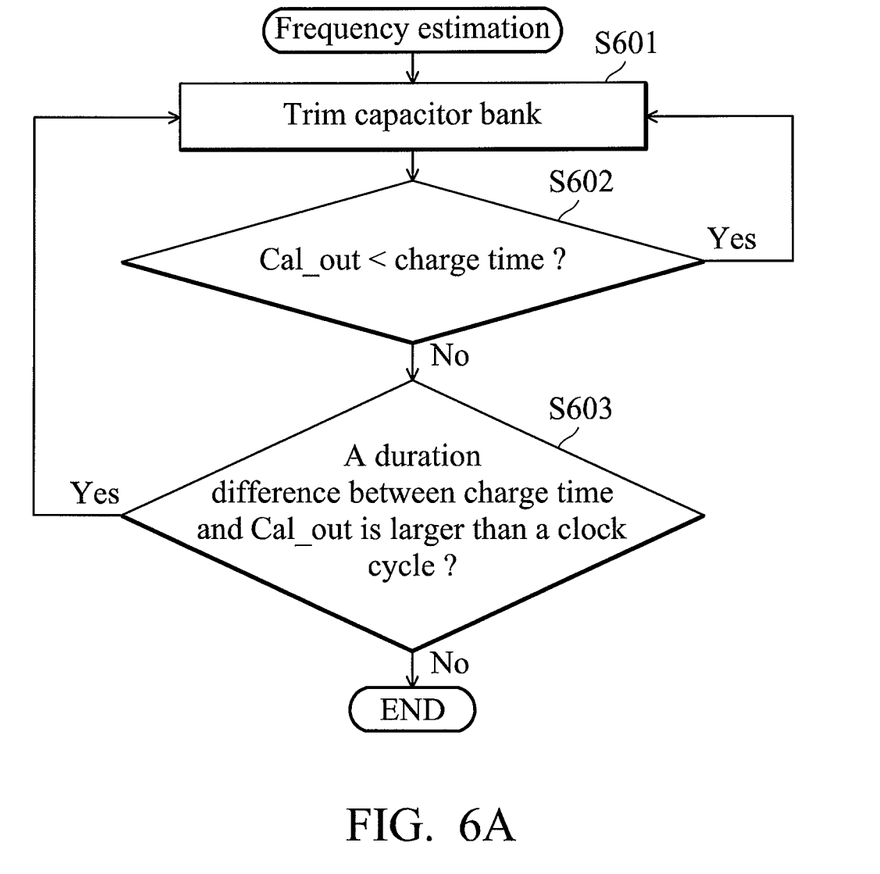
FIG. 6A is a flowchart of a frequency estimation method according to an embodiment of the invention.
Figure 6B:
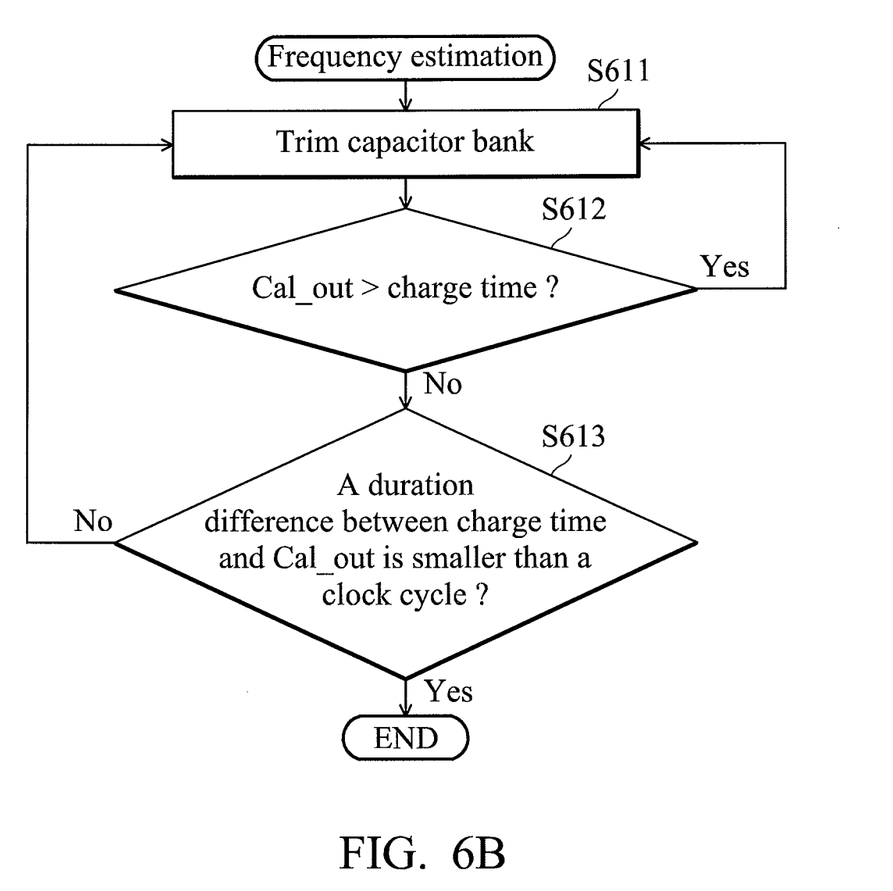
FIG. 6B is a flowchart of a frequency estimation method according to another embodiment of the invention.
Figure 6C:
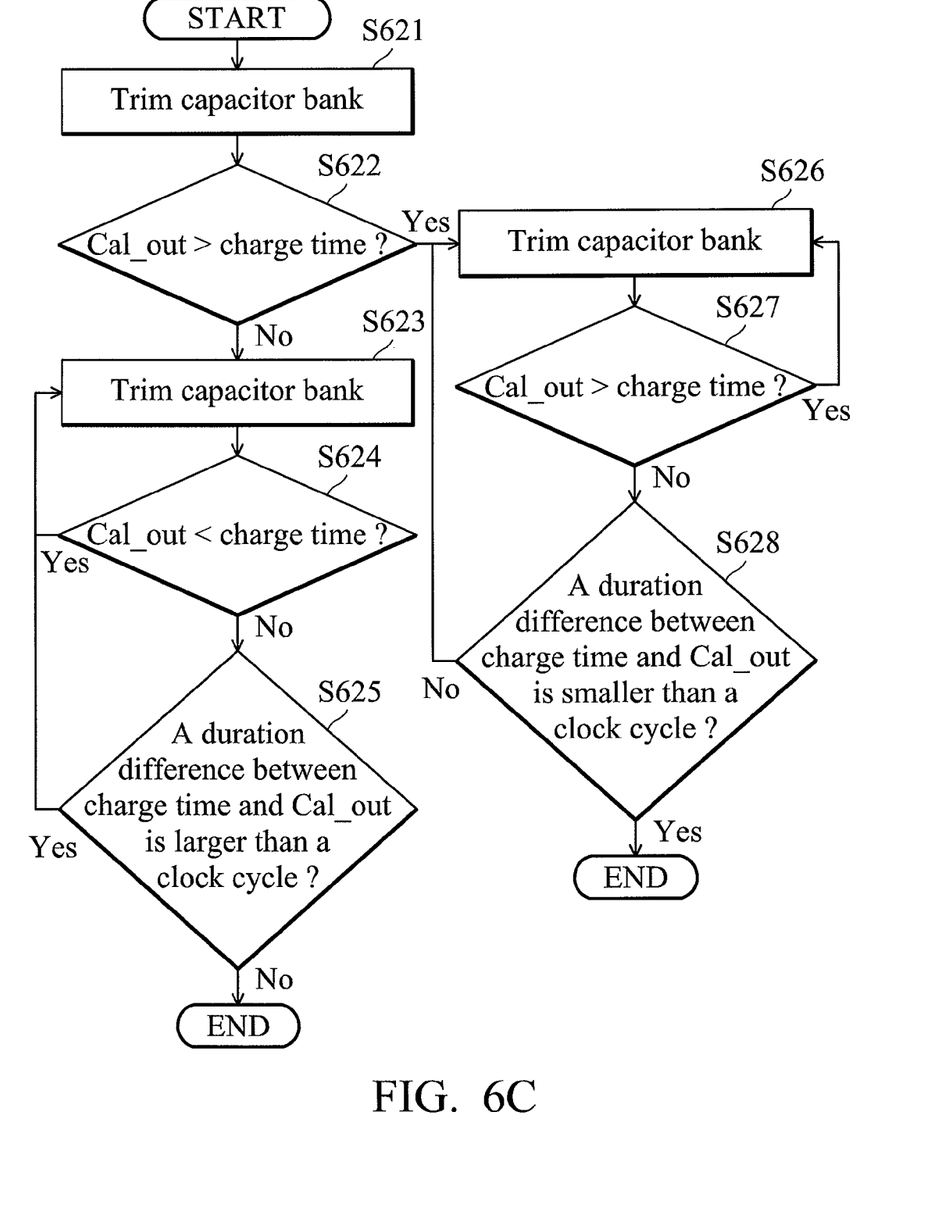
FIG. 6C is a flowchart of a frequency estimation method according to another embodiment of the invention.

FIG. 6A is a flowchart of a frequency estimation method according to an embodiment of the invention. The frequency estimation method is not used to get a real frequency, but to determine whether an equivalent capacitance of a capacitor bank corresponds to an actual operation frequency. The frequency estimation methods in FIGS. 6A~6C are illustrated with the circuits of FIG. 5. Before estimating the frequency, a pulse width is made to be served as a charging time according an operation clock of an electronic system. In step S601, a capacitance of a capacitor bank is set to a default capacitance, such as a maximum capacitance or a minimum capacitance of the capacitor bank.

In step S602, the charging time estimation unit 51 determines whether a duration is less than the charging time, such as the condition 71 shown in FIG. 7, wherein the duration is that a voltage of an output signal Cal_out is pulled up to a high logic level. In other words, the charging time estimation unit 51 determines whether a second time point that the output signal Cal_out is pulled up to the logic high level is prior to a first time point that charging time ends.

If yes, the procedure returns to step S601 to trim the capacitance of the capacitor bank 53. If not, step S603 is executed. In step S603, the charging time estimation unit 51 determines whether time duration between the first time point and the second time point is greater than a clock cycle. If yes, the procedure returns to step S601 to trim the capacitance of the capacitor bank 53. If not, the charging time estimation unit 51 does not trim the capacitor bank 53 because the current capacitance of the capacitor bank 53 correctly corresponds to the operation frequency. The charging time estimation unit 51 transmits a current control signal of the capacitor bank 53 to a lookup table circuit or a control circuit for further processing.

In this embodiment, the control method of capacitor bank 53 is similar to the control method of resistor bank 32. Thus, the detail control method for adjusting the capacitor bank 53 can refer to the resistance adjusting method of the resistor bank 32 described in paragraphs of FIG. 3.

FIG. 6B is a flowchart of a frequency estimation method according to another embodiment of the invention. Before estimating the frequency, a pulse width is mad e to be served as a charging time according an operation clock of an electronic system. In step S611, a capacitance of a capacitor bank is set to a default capacitance, such as a maximum capacitance or a minimum capacitance of the capacitor bank.

In step S612, the charging time estimation unit 51 determines whether a duration is greater than the charging time, such as the condition 73 shown in FIG. 7, wherein the duration is that a voltage level of the output signal Cal_out is pulled up to a high logic level. In other words, the charging time estimation unit 51 determines whether a first time point that charging time ends 1 is prior to a second time point that the output signal Cal_out is pulled up to the logic high level.

If yes, the procedure returns to step S611 to trim the capacitance of the capacitor bank 53. If not, step S613 is executed. In step S613, the charging time estimation unit 51 determines whether time duration between the first time point and the second time point is less than a clock cycle. If not, the procedure returns to step S611 to increase the capacitance of the capacitor bank 53 again. If yes, the charging time estimation unit 51 does not trim the capacitor bank 53 because the current capacitance of the capacitor bank 53 correctly corresponds to the operation frequency. The charging time estimation unit 51 transmits a current control signal of the capacitor bank 53 to a lookup table circuit or a control circuit for further processing.

FIG. 6C is a flowchart of a frequency estimation method according to another embodiment of the invention. Before estimating the frequency, a pulse width is made to be served as a charging time according an operation clock of an electronic system. In step S621, a capacitance of a capacitor bank is set to a default capacitance, such as a maximum capacitance or a minimum capacitance of the capacitor bank. In step S622, the charging time estimation unit 51 determines whether a duration is greater than the charging time, such as a condition 73 shown in FIG. 7, wherein the duration is that a voltage of an output signal Cal_out is pulled up to a high logic level. In other words, the charging time estimation unit 51 determines whether a first time point that charging time ends is prior to a second time point that the output signal Cal_out is pulled up to the logic high level. If yes, step S626 is executed to reduce the capacitance of the capacitor bank 53. If not, step S623 is executed to increase the capacitance of the capacitor bank 53.

In step S624, the charging time estimation unit 51 determines whether a duration is less than the charging time, such as the condition 71 shown in FIG. 7, wherein the duration is that a voltage of an output signal Cal_out is pulled up to a high logic level. In other words, the charging time estimation unit 51 determines whether the second time point that the output signal Cal_out is pulled up to the logic high level is prior to the first time point that charging time ends.

If yes, the procedure returns to step S623 to trim the capacitance of the capacitor bank 53. If not, step S625 is executed. In step S625, the charging time estimation unit 51 determines whether time duration between the first time point and the second time point is greater than a clock cycle. If yes, the procedure returns to step S623 to reduce the capacitance of the capacitor bank 53. If not, the charging time estimation unit 51 does not trim the capacitor bank 53 because the current capacitance of the capacitor bank 53 correctly corresponds to the operation frequency. The charging time estimation unit 51 transmits a current control signal of the capacitor bank 53 to a lookup table circuit or a control circuit for further processing.

In step S627, the charging time estimation unit 51 determines whether a duration is greater than the charging time, such as a condition 73 shown in FIG. 7, wherein the duration is that a voltage of an output signal Cal_out is pulled up to a high logic level. In other words, the charging time estimation unit 51 determines whether a first time point that charging time ends is prior to a second time point that the output signal Cal_out is pulled up to the logic high level. If yes, step S626 is executed to trim the capacitance of the capacitor bank 53. If not, step S628 is executed. In step S628, the charging time estimation unit 51 determines whether time duration between the first time point and the second time point is less than a clock cycle. If not, the procedure returns to step S626 to increase the capacitance of the capacitor bank 53 again. If yes, the charging time estimation unit 51 does not trim the capacitor bank 53 because the current capacitance of the capacitor bank 53 correctly corresponds to the operation frequency. The charging time estimation unit 51 transmits a current control signal of the capacitor bank 53 to a lookup table circuit or a control circuit for further processing.

The methods or circuits of embodiments above are described individually, but the invention is not limited in that. The method and circuits of described embodiments can be integrated in a new embodiment.

Figure 8:
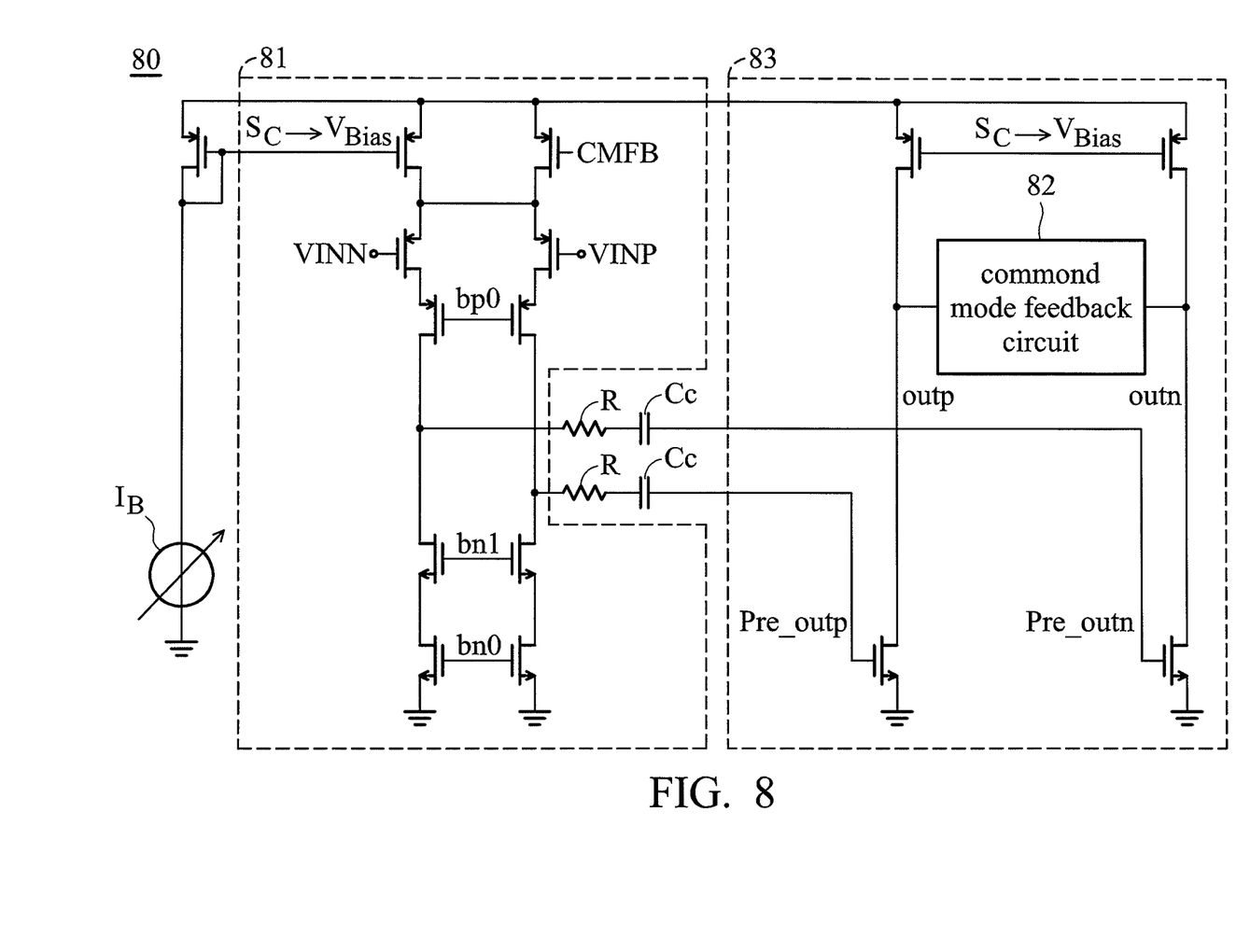
FIG. 8 is a circuit diagram of a two-stage operational amplifier according to an embodiment of the invention.
Figure 9:
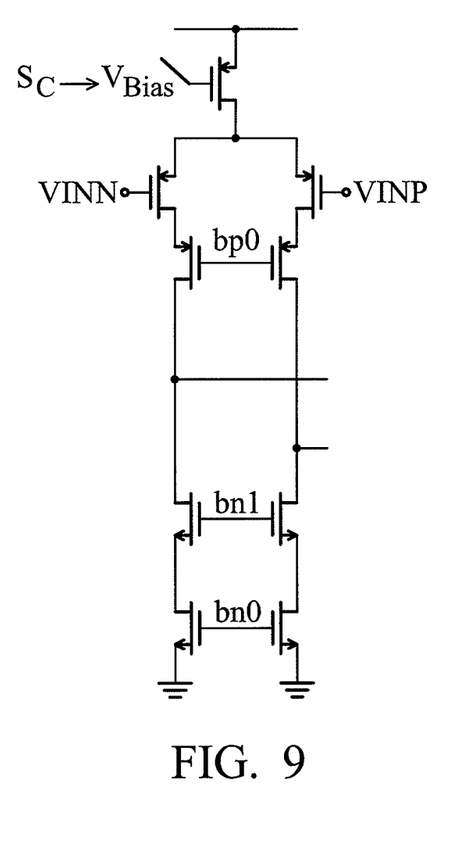
FIG. 9 is a circuit diagram of a voltage gain and gain bandwidth adjusting circuit.
Figure 10:
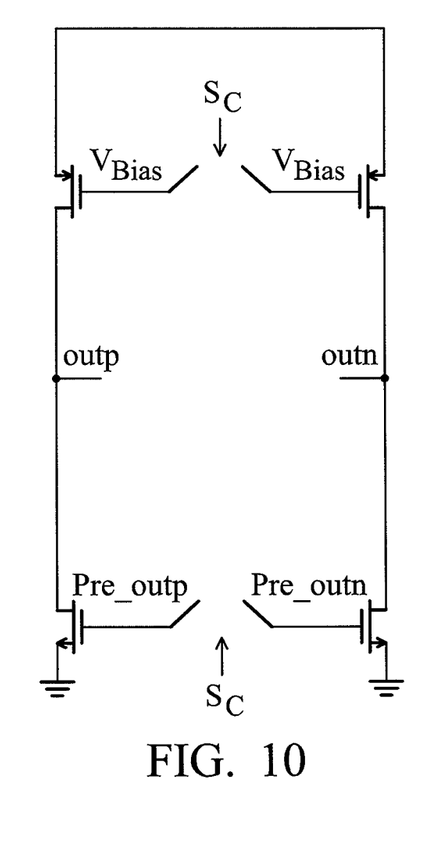
FIG. 10 is circuit diagram of a slew rate adjusting circuit.

FIG. 8 is a circuit diagram of a two-stage operational amplifier. In the described embodiments, parameters for controlling a bias voltage $V_{Bias}$ and a current $I_B$ are acquired by a lookup table circuit. In another embodiment, the parameter is the control signal Sc shown in Figures, and the generation of the control signal Sc can be referred to FIG. 1 and FIG. 2. A DC gain, a gain bandwidth and a slew rate of the operational amplifier are adjusted by adjusting the bias voltage $V_{Bias}$ and the current $I_B$. Furthermore, operations of the operational amplifier can be optimized by using a self-configuration mechanism. In this embodiment, a circuit 81 is used to adjust a gain bandwidth or a DC gain of the operational amplifier. The circuit 83 comprises a common mode feedback circuit 82 to adjust a slew rate of the operational amplifier. In another embodiment, the circuit 81 is made up of circuit modules, such as shown in FIG. 9 to avoid that the single circuit 81 cannot correctly adjust the gain bandwidth and the DC gain of the operational amplifier. Similarly, the circuit 83 also can be made up of circuit modules, such as shown in FIG. 10 to avoid that the single circuit 83 cannot pull the voltage to a predetermined voltage level quickly. Note that the circuit 83 may comprise a plurality of circuit modules of FIG. 10 but only one common mode feedback circuit 82 is required for the circuit 83.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An auto configuration method for an operational amplifier in an electronic system, the method comprising:
   estimating an internal resistance of the electronic system, wherein the step of estimating the internal resistance is implemented by adjusting a resistance of a resistor bank of the electronic system, and when the resistance of the resistor bank is determined, a first control signal of the resistor bank is stored;
   estimating an operation frequency of the electronic system; and
   determining a control parameter to adjust a characteristic of the operational amplifier according to the internal resistance and the operation frequency.

2. The method as claimed in claim 1, wherein the internal resistance is estimated according to an external resistor of the electronic system.

3. The method as claimed in claim 1, wherein the step of estimating the operation frequency of the electronic system is implemented by adjusting a capacitance of a capacitor bank, and when the capacitance of the capacitor bank is determined, a second control signal of the capacitor bank is stored.

4. The method as claimed in claim 3, wherein the control parameter is determined via a lookup table circuit according the first control signal and the second control signal.

5. An electronic system capable of auto configuring an operational amplifier, comprising:
   a resistance calibration circuit to estimate an internal resistance of the electronic system and generate a first control signal;
   a frequency estimation circuit to adjust a capacitance of a capacitor bank according to the internal resistance and a clock signal of the electronic system and generate a second control signal;

a lookup table circuit receiving the first control signal and the second control signal to get a control parameter by using lookup table; and an operational amplifier receiving the control parameter to adjust a characteristic of the operation amplifier.

6. The system as claimed in claim 5, further comprising a resistor bank having a plurality of resistors and switches, wherein the resistance calibration circuit adjusts the resistance of the resistor bank to be equal to the resistance of an external resistor of the electronic system, and the first control signal controls the switches.

7. The system as claimed in claim 5, further comprising:
a comparator having an positive input terminal and a negative input terminal, wherein the positive input terminal is coupled to the capacitor bank, and the negative input terminal receives a reference voltage; and a charging time estimation module to generate the second control signal according to the clock signal and an output signal of the comparator.

8. The system as claimed in claim 5, wherein the charging time estimation module estimates a charging time according to the clock signal, and adjust the capacitance of the capacitor bank according to the charging time and a duration that the voltage of the positive input terminal charges to the reference voltage.

9. The system as claimed in claim 5, wherein the control parameter adjusts a DC gain, a gain bandwidth or a slew rate of the operational amplifier.

\* \* \* \* \*